United States Patent
Byeon

(10) Patent No.: US 7,800,424 B2
(45) Date of Patent: Sep. 21, 2010

(54) APPARATUS FOR SUPPLYING OVERDRIVING SIGNAL

(75) Inventor: Sang Jin Byeon, Ichon (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 11/958,277

(22) Filed: Dec. 17, 2007

(65) Prior Publication Data

US 2008/0191748 A1 Aug. 14, 2008

(30) Foreign Application Priority Data

Feb. 9, 2007 (KR) .................. 10-2007-0014064

(51) Int. Cl.
*G06F 1/04* (2006.01)

(52) U.S. Cl. .................. 327/294; 327/75; 327/298; 327/408

(58) Field of Classification Search .......... 327/50–57, 327/142, 198, 68–70, 143, 172–176, 291–299, 327/407–413, 74–78; 365/205, 207, 208
See application file for complete search history.

(56) References Cited

U.S. PATENT DOCUMENTS

| | | | | |
|---|---|---|---|---|
| 5,179,495 | A * | 1/1993 | Zuzuly | 361/94 |
| 5,659,260 | A * | 8/1997 | Kajimoto et al. | 327/55 |
| 5,942,937 | A * | 8/1999 | Bell | 329/303 |
| 5,986,866 | A * | 11/1999 | Zuzuly | 361/93.4 |
| 6,768,698 | B2 * | 7/2004 | Kono | 365/233.1 |
| 6,853,593 | B1 | 2/2005 | Bae | |
| 6,914,462 | B2 * | 7/2005 | Kim et al. | 327/143 |
| 6,987,418 | B2 * | 1/2006 | Kim et al. | 330/10 |
| 7,042,275 | B2 * | 5/2006 | Suwa et al. | 327/536 |
| 7,116,148 | B2 * | 10/2006 | Minzoni | 327/158 |
| 7,173,857 | B2 * | 2/2007 | Kato et al. | 365/185.21 |
| 7,538,601 | B2 * | 5/2009 | Kwean | 327/536 |
| 2004/0201411 | A1 * | 10/2004 | White | 327/407 |
| 2005/0013175 | A1 | 1/2005 | Bae | |
| 2006/0023563 | A1 * | 2/2006 | Yoo | 365/233 |
| 2006/0171714 | A1 * | 8/2006 | Dove | 398/71 |

FOREIGN PATENT DOCUMENTS

| | | |
|---|---|---|
| JP | 10-302467 | 11/1998 |
| JP | 10-340583 | 12/1998 |
| JP | 2002-074960 | 3/2002 |
| KR | 1020020053491 | 7/2002 |
| KR | 1020020057280 A | 7/2002 |
| KR | 1020070036633 A | 4/2007 |

\* cited by examiner

*Primary Examiner*—Long Nguyen
*Assistant Examiner*—Sibin Chen
(74) *Attorney, Agent, or Firm*—Baker & McKenzie LLP

(57) ABSTRACT

An apparatus for supplying an overdriving signal in a memory apparatus. The apparatus includes: a voltage detecting block that outputs a plurality of detection signals according to the level of an external voltage, and a pulse generator that outputs the overdriving signals having different pulse widths according to the plurality of detection signals.

16 Claims, 6 Drawing Sheets

APPARATUS FOR SUPPLYING OVERDRIVING SIGNAL

CROSS-REFERENCES TO RELATED APPLICATION

The present application claims priority under 35 U.S.C. 119(a) to Korean Patent Application number 10-2007-0014064, filed on Feb. 9, 2007, in the Korean Intellectual Property Office, the contents of which are incorporated herein by reference in their entirety as if set forth in full.

BACKGROUND

1. Technical Field

The embodiments described herein relate to a semiconductor integrated circuit, and more particularly, to an apparatus for supplying an overdriving signal in a semiconductor integrated circuit.

2. Related Art

Many conventional semiconductor memory apparatus, including Dynamic Random Access Memory (DRAM) apparatus, use cross coupled sense amplifiers. When a voltage applied to the sense amplifier reaches a threshold voltage (VT) level, the sensing speed considerably decreases, which can have an adverse effect. In order to solve the problem, an overdriving scheme is used, where the sense amplifier receives a voltage Vcore as a driving voltage, and an external voltage VDD as an overdriving voltage.

As shown in FIG. 1, a conventional overdriving signal supplying apparatus includes first to third NMOS transistors NM1, NM2, and NM3, a sense amplifier 2000, and a precharging unit 3000.

The first to third NMOS transistors NM1 to NM3 respectively receive first to third sense amplifier control signals (SAP1), (SAP2), and (SAN) and supply to the sense amplifier 2000 the external voltage VDD, the core voltage Vcore, and a ground voltage VSS, respectively. The precharging unit 3000 supplies a pre-charge voltage Vblp to the sense amplifier 2000 in a precharge mode.

As shown in FIG. 2, in the overdriving signal supplying apparatus, when a word line WL is enabled and then the third sense amplifier control signal (SAN) is enabled, the ground voltage VSS is supplied to the sense amplifier 2000. Then, the first sense amplifier control signal (SAP1) is enabled for a predetermined time to overdrive sense amplifier 2000, causing the external voltage VDD to be supplied to the sense amplifier 2000. Therefore, amplification by the sense amplifier 2000 can be rapidly performed. Subsequently, the second sense amplifier control signal (SAP2) is enabled, and the first sense amplifier control signal (SAP1) is disabled, so that the core voltage Vcore is supplied to the sense amplifier 2000. In this way, a pair of bit lines of the sense amplifier 2000 reach the core voltage Vcore and the ground voltage VSS, respectively.

However, it is difficult to maintain the overdriving voltage at a fixed value due to the external voltage VDD. That is, the threshold voltage and current of transistors included in the sense amplifier 2000 change according to the external voltage VDD. Therefore, when the external voltage VDD is low, the overdriving voltage may be low, and when the external voltage VDD is high, excessive overdriving may occur. As a result, when the overdriving voltage is lower, a sensing margin of the sense amplifier 2000 is reduced, which may cause a malfunction. Simply increasing the overdriving voltage can cause the sensitivity of the sense amplifier 2000 to be lowered and power consumption to increase. Also, when the external voltage VDD exhibits significant noise, the reliability and sensitivity of a sense amplifier are considerably lowered.

SUMMARY

An apparatus for supplying an overdriving signal and capable of changing the width of the overdriving signal according to the level of an external voltage to increase a sensing speed and to ensure a sensing margin.

According to one aspect, there is provided an apparatus for supplying an overdriving signal. The apparatus includes a voltage detecting block that outputs a plurality of detection signals according to the level of an external voltage, and a pulse generator that outputs the overdriving signals having different pulse widths in response to the plurality of detection signals.

According to another aspect, there is provided an apparatus for supplying an overdriving signal. The apparatus includes a voltage detecting block that detects the level of an external voltage, defines sections of the external voltage, and outputs a plurality of detection signals that are activated or inactivated in a specific voltage section and a pulse generator that outputs the overdriving signals of different pulse widths corresponding to the plurality of detection signals that are generated according to the detected level of the external voltage.

According to still another aspect, there is provided an apparatus for supplying an overdriving signal. The apparatus includes a voltage detecting block including a plurality of detectors each of which compares a reference voltage with a divided voltage that is proportional to a detected external voltage and outputs a detection signal corresponding to the result of the comparison and a pulse generator that outputs the overdriving signals of different pulse widths corresponding to the plurality of detection signals that are generated according to the level of the detected external voltage. The pulse generator includes a plurality of signal generators that generate pulses of different widths, the number of pulses corresponding to the number of detection signals and a pulse selecting unit that selects one of the output signals of the plurality of signal generators in response to the detection signals, and outputs the selected signal as the overdriving signal.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
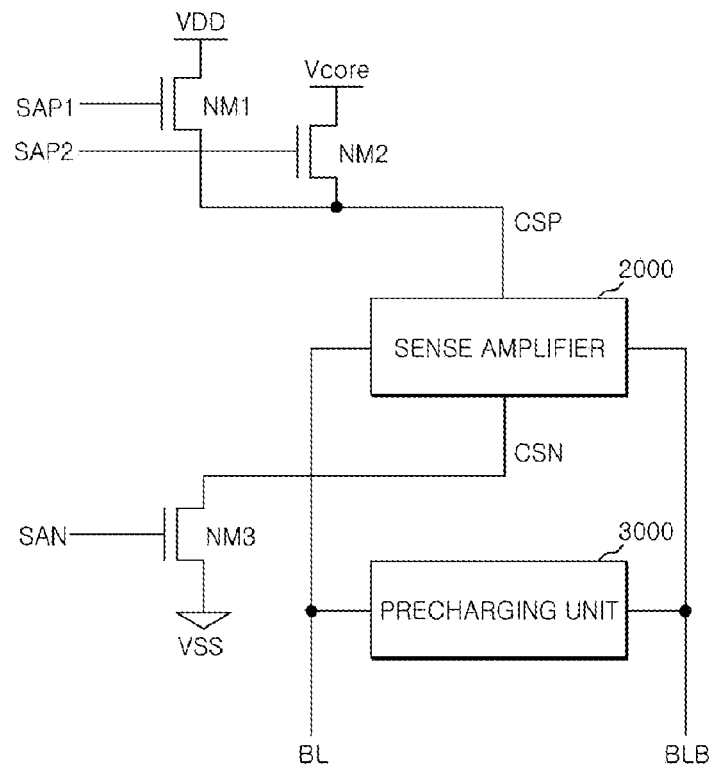
FIG. 1 is a block diagram illustrating an exemplary semiconductor memory apparatus that includes an overdriving scheme including a sense amplifier.
Figure 2:
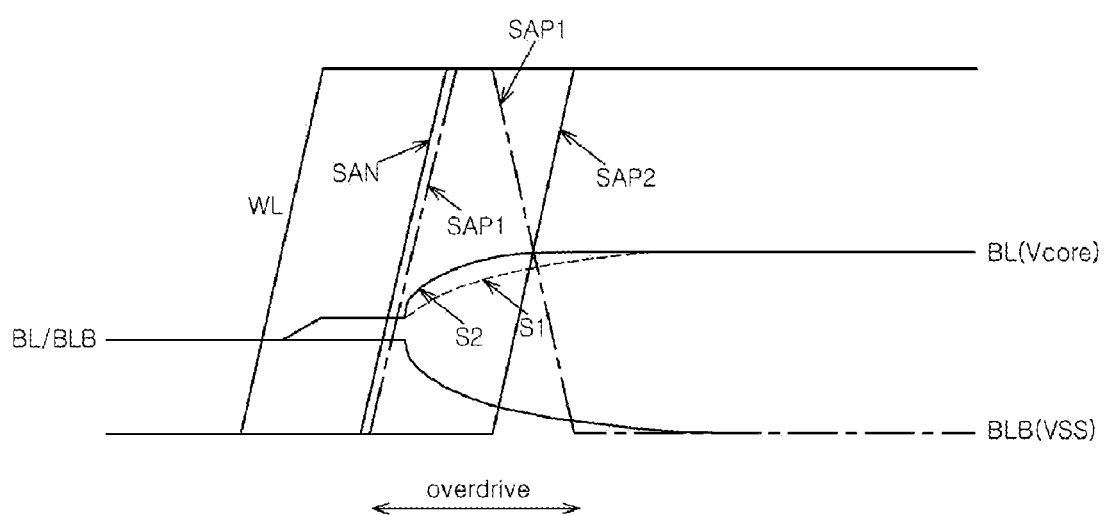
FIG. 2 is a waveform diagram illustrating the operation of the sense amplifier shown in FIG. 1.
Figure 3:
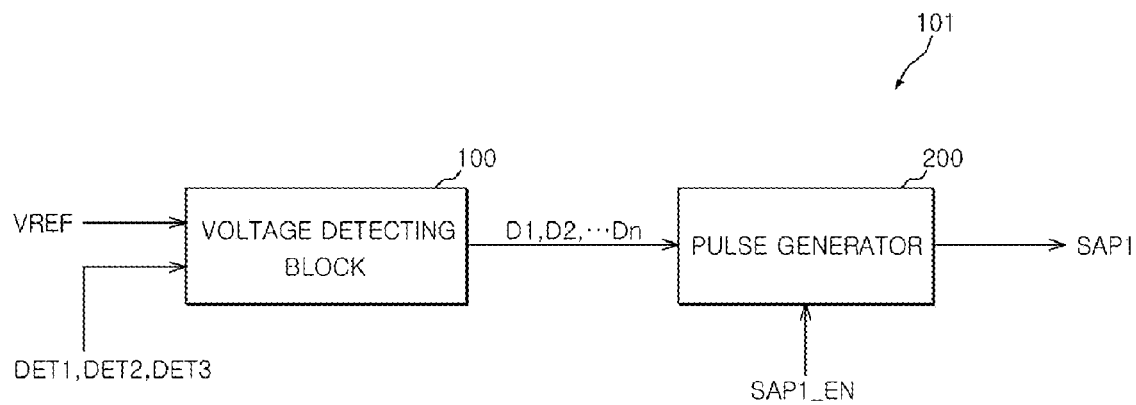
FIG. 3 is a block diagram illustrating an apparatus for supplying an overdriving signal according to one embodiment.

FIG. 3 is a diagram illustrating a overdriving signal supplying apparatus 101 configured in accordance with one embodiment. As can be seen, the overdriving signal supplying apparatus 101 can include a voltage detecting block 100 and a pulse generator 200. The voltage detecting block 100 can be configured to generate a plurality of detection signals D1, D2, ... and Dn (where n is an integer number) according to the level of an external voltage VDD. The voltage detecting block 100 can be implemented as a general level detector circuit, depending on the embodiment. The pulse generator 200 can be configured to generate signals having different pulse widths according to the plurality of detection signals D1, D2, ..., and Dn, and to output.

The overdriving signal supplying apparatus 101 shown in FIG. 3 can be configured to generate a first sense amplifier control signals (SAP1) having different pulse widths according to the level of the external voltage VDD. More specifically, when the external voltage VDD is low, the overdriving signal supplying apparatus 101 can be configured to generate the first sense amplifier control signal (SAP1) having a large pulse width. On the other hand, when the external voltage VDD is high, the overdriving signal supplying apparatus 101 can be configured to generate the first sense amplifier control signal (SAP1) having a small pulse width. In this way, it is possible to solve the problem of slow sensing and amplifying operations when the external voltage VDD is low and the problem of excessive sensing and amplifying operations when the external voltage VDD is high, which results in an increase in sensing margin.

Figure 4:
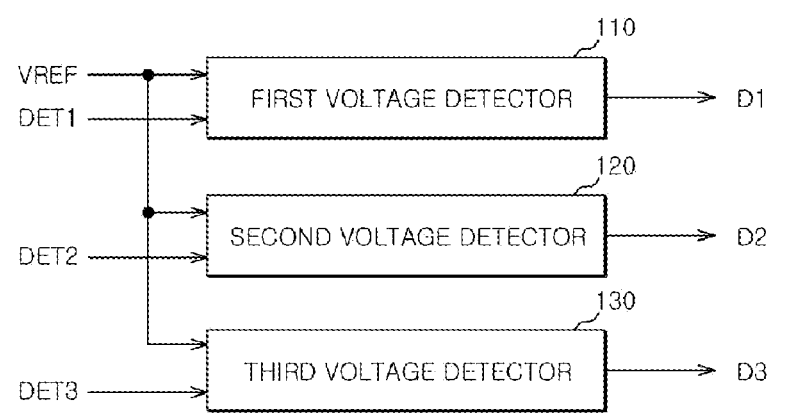
FIG. 4 is a block diagram illustrating a voltage detecting block that can be included in the apparatus illustrated in FIG. 3.

FIG. 4 is a diagram illustrating a voltage detecting block 100 in more detail. As shown in FIG. 4, the voltage detecting block 100 can include a first to third voltage detectors 110, 120, and 130. Three voltage detectors are illustrated for the convenience of explanation, but the invention is not limited thereto.

The first to third voltage detectors 110, 120, and 130 can be configured to compare a reference voltage VREF with first to third divided voltages DET1, DET2, and DET3, respectively. In this way, the first to third voltage detectors 110, 120, and 130 can generate detection signals D1, D2, and D3 according to the results of the comparison.

The first to third divided voltages DET1, DET2, and DET3 can have sequentially higher voltage levels, while the external voltage VDD has a constant level. Therefore, the first to third detection signals D1, D2, and D3, which are output signals of the first to third voltage detectors 110, 120, and 130, can have different values according to the level of the external voltage VDD.

Figure 5:
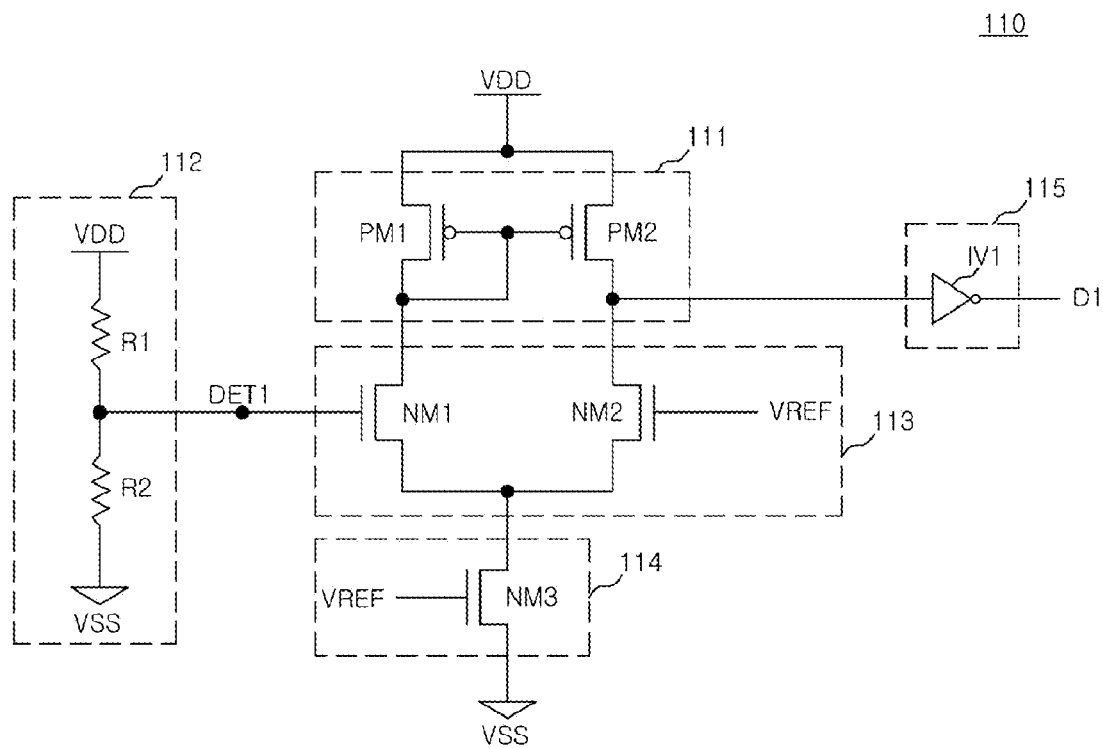
FIG. 5 is a detailed circuit diagram illustrating first voltage detector that can be included in the block illustrated in FIG. 4.

As illustrated in FIG. 5, the first voltage detector 110 can include a voltage dividing unit 112, a current supply unit 111, a current passing unit 114, a comparator 113, and an output buffering unit 115.

The voltage dividing unit 112 can divide the external voltage VDD to generate a first divided voltage DET1. The voltage dividing unit 112 can, e.g., include a first resistor R1 and a second resistor R2 connected in series to each other. The first resistor R1 and the second resistor R2 divide the external voltage VDD to generate the first divided voltage DET1.

The comparator 113 can, e.g., includes first and second NMOS transistors NM1 and NM2. In this example, the first NMOS transistor NM1 has a gate to which the first divided voltage DET1 is applied, a drain connected to the current supply unit 111, and a source connected to the current passing unit 114. The second NMOS transistor NM2 has a gate to which the reference voltage VREF is applied, a drain connected to the current supply unit 111, and a source connected to the current passing unit 114.

The current supply unit 111 can, e.g., include first and second PMOS transistors PM1 and PM2. The first and second PMOS transistors PM1 and PM2 have gates connected to each other, sources to which the external voltage VDD is applied, and drains connected to the comparator 113.

The current passing unit 114 can, e.g., include a third NMOS transistor NM3 having a drain connected to the sources of the first and second NMOS transistors NM1 and NM2, a gate to which the reference voltage VREF is applied, and a source connected to a ground line.

The output buffering unit 115 can, e.g., include a first inverter IV1 that receives an output signal of the comparator 113, for example, a drain voltage of the second NMOS transistor NM2, inverts the received signal, and buffers the inverted signal.

In first voltage detector 110 having the above-mentioned structure, when the first divided voltage DET1 is lower than the reference voltage VREF, the second NMOS transistor NM2 has a higher driving performance than the first NMOS transistor NM1, so that the drain voltage of the second NMOS transistor NM2 changes to a low level, and the output buffering unit 115 outputs a high-level signal.

When the first divided voltage DET1 is higher than the reference voltage VREF, the second NMOS transistor NM2 has a lower driving performance than the first NMOS transistor NM1, so that the drain voltage of the second NMOS transistor NM2 changes to a high level, and the output buffering unit 115 outputs a low-level signal.

The second and third voltage detectors 120 and 130 can have the same structure as the first voltage detector 110, but the second and third voltage detectors 120 and 130 can adjust the levels of the second and third divided voltages DET2 and DET3 to be different from each other by changing the resistance ratio of the voltage dividing units 112 provided therein. Therefore, this structure makes it possible to perform control such that only one of the detection signals D1 to D3 is activated according to the level of the external voltage VDD supplied from the outside. That is, it is possible to trim the sections of the divided voltages DET1, DET2, and DET3 by minutely adjusting the resistance ratios of the voltage detectors 110, 120, and 130.

For example, the resistance ratios of the first to third voltage detectors can be adjusted such that, when the reference voltage is equal to the general external voltage VDD, the second detection signal D2 is activated. Furthermore the resistance ratios of the first to third voltage detectors can be adjusted such that, when the reference voltage is lower or higher than the general external voltage VDD, the first detection signal D1 or the third detection signal D3 are activated, respectively. However, the detected levels and reference level of the detection signals D1, D2, and D3 can be changed according to the structure or the applicable range of a semiconductor integrated circuit.

Further, the voltage detectors 110 to 130 are illustrated as including the voltage dividing units 112 having different resistance ratios, and the same reference voltage VREF is used. However, the embodiments described herein are not necessarily so limited.

Figure 6:
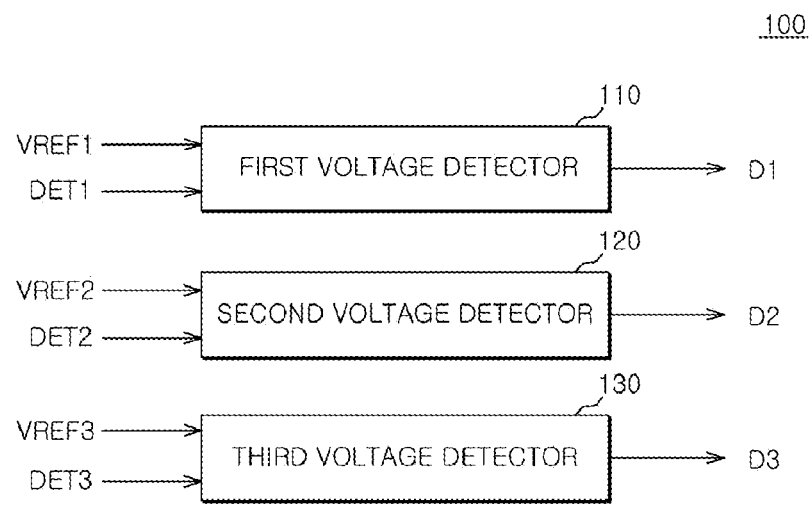
FIG. 6 is a block diagram illustrating an alternative embodiment of a voltage detecting block that can be included in the apparatus illustrated in FIG. 3.

For example, the voltage detectors 110 to 130 can be configured such that the voltage dividing units 112 have the same resistance ratio, and as shown in FIG. 6, different reference voltages VREF1, VREF2, and VREF3, are applied, respectively. In this case, it is possible to activate only one of the detection signals D1 to D3 according to the supplied external voltage VDD.

Figure 7:
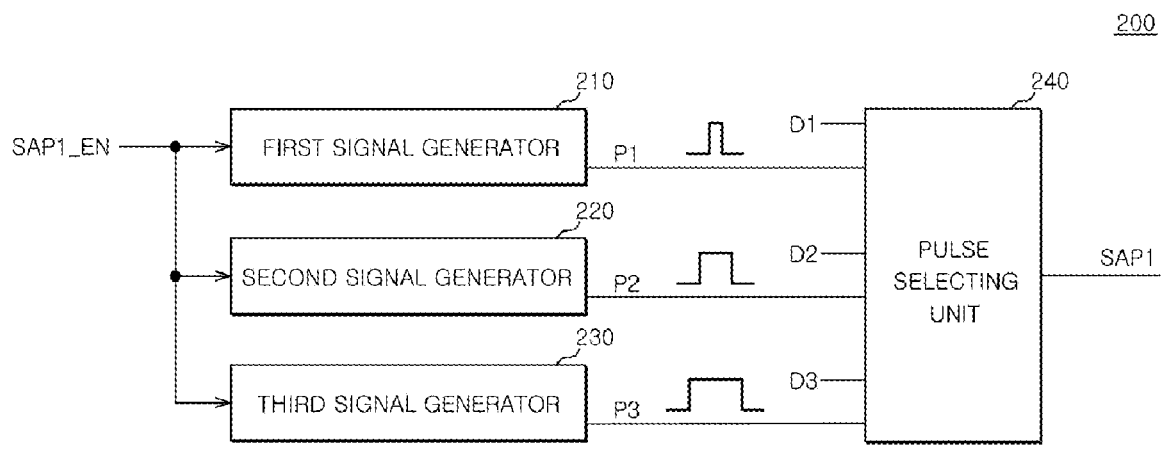
FIG. 7 is a block diagram illustrating a pulse generator that can be included in the apparatus illustrated in FIG. 3.

Referring to FIG. 7, the pulse generator 200 can include first to third signal generators 210, 220, and 230 and a pulse selecting unit 240. The first to third signal generators 210 to 230 can be configured to receive a control signal (SAP1_EN) for driving the pulse generator 200 to generate signals having different pulse widths. The first to third signal generators 210, 220, and 230 can be, for example, implemented as pulse generating circuits.

Figure 8:
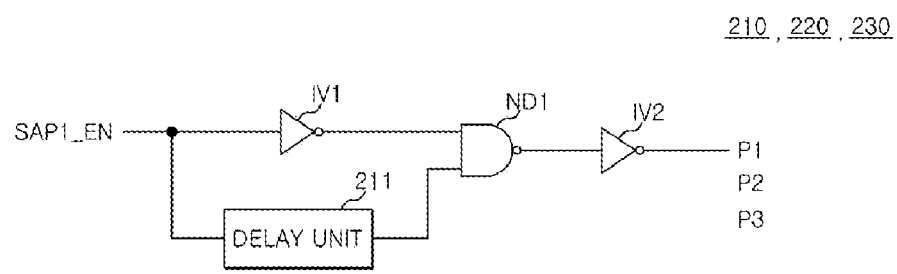
FIG. 8 is a detailed circuit diagram illustrating the first, second and third signal generators that can be included in the pulse generator illustrated in FIG. 7.

Specifically, as shown in FIG. 8, the first to third signal generators 210 to 230 can each include a delay unit 211 that delays the control signal (SAP1_EN) by a predetermined amount of time, a first NAND gate ND1 that receives an inverted signal of the control signal (SAP1_EN) and an output signal of the delay unit 211 and performs an operation on the received signals, and a second inverter IV2 that inverts an output signal of the first NAND gate ND1. When the control signal (SAP1_EN) is enabled, the first to third signal generators 210 to 230 output signals P1, P2, and P3 having a pulse width that is delayed by the delay time of the asserted delay unit 211, respectively. In order to generate signals having different pulse widths, the first to third signal generators 210 to 230 include delay units 211 having different delay times.

The delay unit 211 can be formed of a general delay circuit including some or all of an inverter, a resistor, and a capacitor.

The pulse selecting unit 240 selects one of the output signals of the first to third signal generators 210 to 230, and outputs the selected signal in response to the detection signals D1, D2, and D3, which are output signals of the voltage detecting block 100. That is, the pulse selecting unit 240 selects a signal having a small pulse width when the external voltage VDD is high, and selects a signal having a large pulse width when the external voltage VDD is low, in response to the detection signals D1, D2, and D3. Therefore, when the external voltage VDD is low, the external voltage VDD is supplied for a long time to make it increase overdriving time of a sense amplifier 2000. On the other hand, when the external voltage VDD is high, the external voltage VDD is supplied in a short time to make it decrease the overdriving time of the sense amplifier 2000.

In this embodiment, the pulse generator 200 receives three output signals from the voltage detecting block 100, but more or less signals can be received depending on the embodiment. For example, when the voltage detecting block 100 outputs N signals (where N is an integer number), the pulse generator 200 can include N signal generators and a pulse selecting unit 240 having N input terminals.

Figure 9:
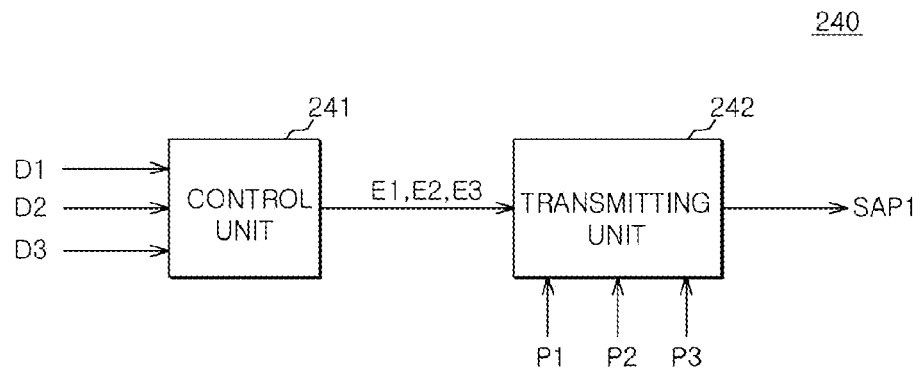
FIG. 9 is a block diagram illustrating a pulse selecting unit that can be included in the pulse generator illustrated in FIG. 7.
Figure 10:
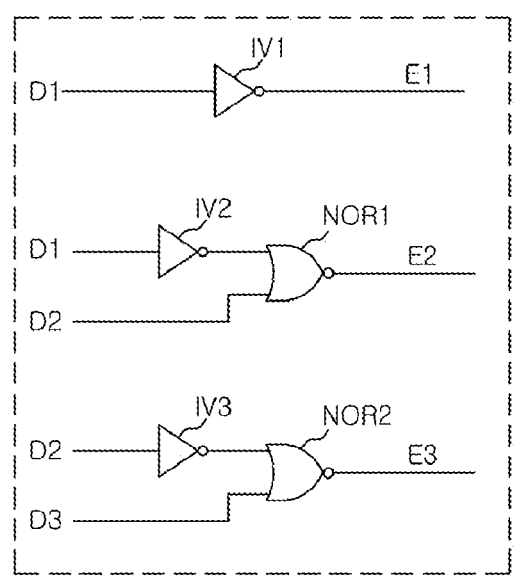
FIG. 10 is a detailed circuit diagram illustrating a control unit that can be included in the pulse selecting unit illustrated in FIG. 9.

Referring to FIG. 9, the pulse selecting unit 240 can include a control unit 241 and a transmitting unit 242. The control unit 241 can be configured to output first to third selection signals E1 to E3 in response to the detection signals D1, D2, and D3. Specifically, as shown in FIG. 10, the control unit 241 can include a first inverter IV1 that inverts the first detection signal D1 and outputs the first selection signal E1. The control unit 241 can further include a second inverter IV2 that inverts the first detection signal D1, a first NOR gate NOR1 that performs a NOR operation on an output signal of the second inverter IV2, and the second detection signal D2 and outputs the second selection signal E2, a third inverter IV3 that inverts the second detection signal D2, and a second NOR gate NOR2 that performs a NOR operation on an output signal of the third inverter IV3 and the third detection signal D3 and outputs the third selection signal E3. In this way, the control unit 241 activates any one of the first to third selection signals E1 to E3 in response to any one of the first to third detection signals D1 to D3 that are activated at low levels.

Figure 11:
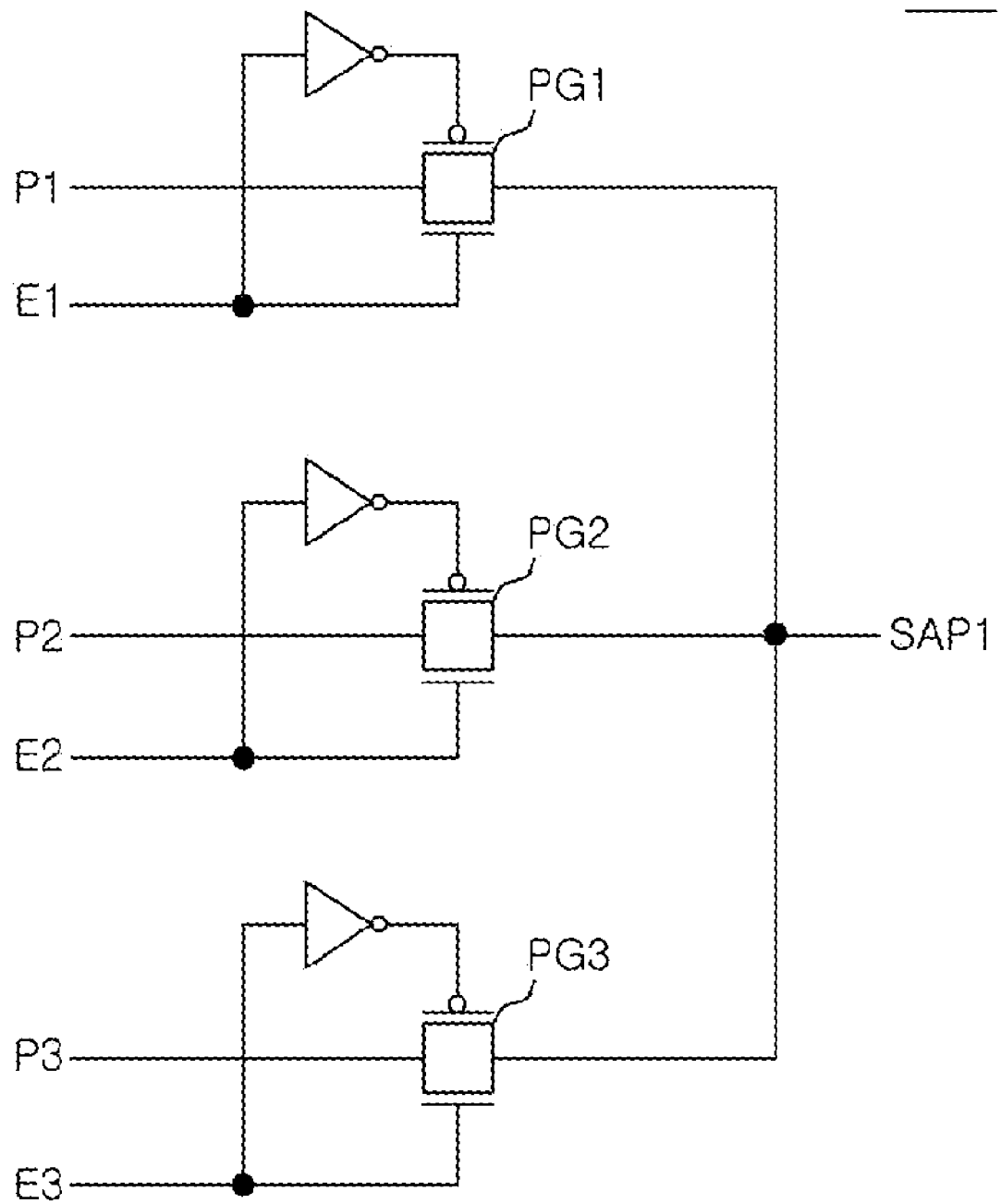
FIG. 11 is a detailed circuit diagram illustrating a transmitting unit that can be included in the pulse selecting unit illustrated in FIG. 9.

As shown in FIG. 11, the transmitting unit 242 can be configured to output any one of the first to third output signals P1, P2, and P3 of the first to third signal generators 210, 220, and 230 in response to the first to third selection signals E1, E2, and E3. The transmitting unit 242 can, e.g., include first to third pass gates PG1, PG2, and PG3. The first pass gate PG1 can be configured to transmit or cut off the first output signal P1 of the first signal generator 210 in response to the first selection signal E1. The second pass gate PG2 can be configured to transmit or cut off the second output signal P2 of the second signal generator 220 in response to the second selection signal E2. The third pass gate PG3 can be configured to transmit or cut off the third output signal P3 of the third signal generator 230 in response to the third selection signal E3. Since only one of the first to third selection signals E1, E2, and E3 is at a high level and the other signals are at low levels, only one of the first to third pass gates PG1 to PG3 is selectively turned on. Therefore, the transmitting unit 242 can transmit only one of the first to third output signals P1 to P3 through the selectively activated pass gate PG1, PG2, or PG3.

Accordingly, a plurality of detection signals can be generated according to the level of the external voltage VDD, which makes it possible to provide overdriving signals having different pulse widths. In this way, the pulse widths of the overdriving signals can be changed according to the level of the external voltage. As a result, it is possible to improve a sensing speed and ensure a sensing margin.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. An apparatus for supplying an overdriving signal, comprising:
a voltage detecting block that receives an external voltage and a plurality of different divided voltages having different voltage levels, and outputs a plurality of detection signals according to the level of the external voltage; and
a pulse generator that generates a plurality of overdriving signals of different pulse widths in response to the plurality of detection signals and outputs one of the generated signals,
wherein the pulse generator comprises:

a plurality of signal generators that generate pulses of different widths, the number of pulses corresponding to the number of detection signals; and a pulse selecting unit that selects one of the output signals of the plurality of signal generators in response to the detection signals, and outputs the selected signal as the overdriving signal.

2. The apparatus for supplying an overdriving signal of claim 1, wherein each of the plurality of signal generators comprises:

a delay unit that delays a control signal;

a NAND gate that receives an inverted signal of the control signal and an output signal of the delay unit and performs an operation on the received signals; and an inverter that inverts an output signal of the NAND gate.

3. The apparatus for supplying an overdriving signal of claim 2, wherein delay time of the delay units of the plurality of signal generators is different.

4. The apparatus for supplying an overdriving signal of claim 1, wherein the pulse selecting unit comprises:

a control unit that generates a selection signal that is activated in response to an enabled detection signal; and a transmitting unit that outputs one of the output signals of the plurality of signal generators in response to an output signal of the control unit.

5. The apparatus for supplying an overdriving signal of claim 4, wherein the control unit is configured to generate selection signals corresponding to the number of detection signals, and when any one of the detection signals is enabled at a low level, the control unit is configured such that the selection signal is activated in response to the detection signal.

6. The apparatus for supplying an overdriving signal of claim 1, wherein the voltage detecting block comprises a plurality of detectors each of which compares a reference voltage with a divided voltage of the plurality of different divided voltages that is proportional to the external voltage and outputs the detection signal corresponding to the result of the comparison.

7. The apparatus for supplying an overdriving signal of claim 6, wherein the plurality of detectors in the voltage detecting block is configured to receive the different divided voltages, so that the voltage detecting block generates different detection signals.

8. The apparatus for supplying an overdriving signal of claim 6, wherein different reference voltages are applied to the plurality of detectors in the voltage detecting block.

9. An apparatus for supplying an overdriving signal, comprising:

a voltage detecting block that detects the level of an external voltage, defines sections of the external voltage, receives a plurality of different divided voltages having different voltage levels, and outputs a plurality of detection signals that are activated or inactivated in a specific voltage section; and a pulse generator that generates a plurality of overdriving signals of different pulse widths corresponding to the plurality of detection signals that are generated according to the detected level of the external voltage and outputs one of the generated signals, wherein the pulse generator comprises:

a plurality of signal generators that generate pulses of different widths, the number of pulses corresponding to the number of detection signals; and a pulse selecting unit that selects one of the output signals of the plurality of signal generators in response to the detection signals, and outputs the selected signal as the overdriving signal.

10. The apparatus for supplying an overdriving signal of claim 9, wherein each of the plurality of signal generators comprises:

a delay unit that delays a control signal;

a NAND gate that receives an inverted signal of the control signal and an output signal of the delay unit and performs an operation on the received signals; and an inverter that inverts an output signal of the NAND gate.

11. The apparatus for supplying an overdriving signal of claim 10, wherein delay time of the delay units of the plurality of signal generators is different.

12. The apparatus for supplying an overdriving signal of claim 9, wherein the pulse selecting unit comprises:

a control unit that generates a selection signal that is activated in response to an enabled detection signal; and a transmitting unit that outputs one of the output signals of the plurality of signal generators in response to an output signal of the control unit.

13. The apparatus for supplying an overdriving signal of claim 12, wherein the control unit is configured to generate selection signals corresponding to the number of detection signals, and when any one of the detection signals is enabled at a low level, the control unit is configured such that the selection signal is activated in response to the detection signal.

14. The apparatus for supplying an overdriving signal of claim 9, wherein the voltage detecting block comprises a plurality of detectors each of which compares a reference voltage with a divided voltage of the plurality of different divided voltages that is proportional to the detected external voltage and outputs the detection signal corresponding to the result of the comparison.

15. The apparatus for supplying an overdriving signal of claim 14, wherein the plurality of detectors in the voltage detecting block is configured to receive the different divided voltages, so that the voltage detecting block generates different detection signals.

16. The apparatus for supplying an overdriving signal of claim 14, wherein different reference voltages are applied to the plurality of detectors in the voltage detecting block.

* * * * *